US012255358B2

(12) United States Patent  
Lee et al.

(10) Patent No.: US 12,255,358 B2  
(45) Date of Patent: Mar. 18, 2025

(54) BATTERY MODULE

(71) Applicant: SK INNOVATION CO., LTD., Seoul (KR)

(72) Inventors: Eung Ho Lee, Daejeon (KR); Hyeong Kwan Kang, Daejeon (KR); Kwan Yong Kim, Daejeon (KR); Sang Yeon Kim, Daejeon (KR); Dong Jin Shin, Daejeon (KR); Seung Hun Lee, Daejeon (KR)

(73) Assignee: SK ON CO., LTD., Seoul (KR)

(*) Notice: Subject to any disclaimer, the term of this patent is extended or adjusted under 35 U.S.C. 154(b) by 216 days.

(21) Appl. No.: 17/574,316

(22) Filed: Jan. 12, 2022

(65) Prior Publication Data

US 2022/0223981 A1 Jul. 14, 2022

(30) Foreign Application Priority Data

Jan. 12, 2021 (KR) ........................ 10-2021-0003729

(51) Int. Cl.
*H01M 10/00* (2006.01)
*H01M 10/42* (2006.01)
(Continued)

(52) U.S. Cl.
CPC ....... *H01M 50/519* (2021.01); *H01M 10/425* (2013.01); *H01M 10/482* (2013.01);
(Continued)

(58) Field of Classification Search
CPC ............. H01M 50/519; H01M 10/425; H01M 10/482; H01M 10/486; H01M 50/298;
(Continued)

(56) References Cited

U.S. PATENT DOCUMENTS

| 2014/0295216 A1* | 10/2014 | Matsuda | ............. | H01M 50/224 |
| | | | | 429/7 |
| 2015/0044511 A1* | 2/2015 | Kim | .................... | H01M 50/209 |
| | | | | 429/7 |

(Continued)

FOREIGN PATENT DOCUMENTS

| JP | 2007-508681 A | 4/2007 |
| JP | 5621765 B2 | 11/2014 |

(Continued)

OTHER PUBLICATIONS

Partial European Search Report for the European Patent Application No. 22151245.2 issued by the European Patent Office on Jun. 9, 2022.

(Continued)

*Primary Examiner* — Nicholas P D'Aniello
(74) *Attorney, Agent, or Firm* — IP & T GROUP LLP

(57) ABSTRACT

A battery module which uses a flexible printed circuit board (FPCB) to provide a transmission path of information on the voltage or temperature thereof sensed by a bus bar. The battery module may have a smaller size in a height direction compared to a case of using a rigid printed circuit board (RPCB) or a wire instead of the FPCB to provide the transmission path of the information on the voltage or temperature, and may thus have improved energy efficiency per volume.

10 Claims, 8 Drawing Sheets

(51) Int. Cl.
   *H01M 10/48*   (2006.01)
   *H01M 50/298*  (2021.01)
   *H01M 50/519*  (2021.01)
   *H05K 1/02*    (2006.01)
   *H05K 1/14*    (2006.01)

(52) U.S. Cl.
   CPC ....... *H01M 10/486* (2013.01); *H01M 50/298* (2021.01); *H05K 1/028* (2013.01); *H05K 1/14* (2013.01); *H01M 2010/4278* (2013.01); *H05K 2201/10037* (2013.01)

(58) Field of Classification Search
   CPC ....... H01M 2010/4278; H01M 50/507; H01M 50/569; H01M 50/284; H05K 1/028; H05K 1/14; H05K 2201/10037; H05K 2201/0999; H05K 1/0284
   See application file for complete search history.

(56) References Cited

U.S. PATENT DOCUMENTS

| | | | |
|---|---|---|---|
| 2018/0090920 A1* | 3/2018 | Shoji | H01M 10/48 |
| 2019/0020012 A1* | 1/2019 | Ju | H01M 50/211 |
| 2019/0198952 A1* | 6/2019 | Choi | H01M 50/209 |
| 2020/0119326 A1 | 4/2020 | Yanagihara et al. | |
| 2020/0274204 A1* | 8/2020 | Dawley | H01M 50/507 |
| 2020/0313139 A1* | 10/2020 | Patterson | H01M 50/581 |
| 2020/0365866 A1 | 11/2020 | Lin et al. | |
| 2020/0411924 A1* | 12/2020 | Yun | H01M 50/298 |

FOREIGN PATENT DOCUMENTS

| | | |
|---|---|---|
| KR | 10-2016-0026469 A | 3/2016 |
| KR | 10-2018-0036404 A | 4/2018 |
| KR | 10-2018-0135701 A | 12/2018 |
| KR | 10-1944111 B1 | 1/2019 |
| KR | 10-2019-0124446 A | 11/2019 |
| WO | 2020/075988 A1 | 4/2020 |
| WO | 2020/138819 A1 | 7/2020 |

OTHER PUBLICATIONS

Extended European Search Report for the European Patent Application No. 22151245.2 issued by the European Patent Office on Sep. 9, 2022.

* cited by examiner

[FIG. 1]
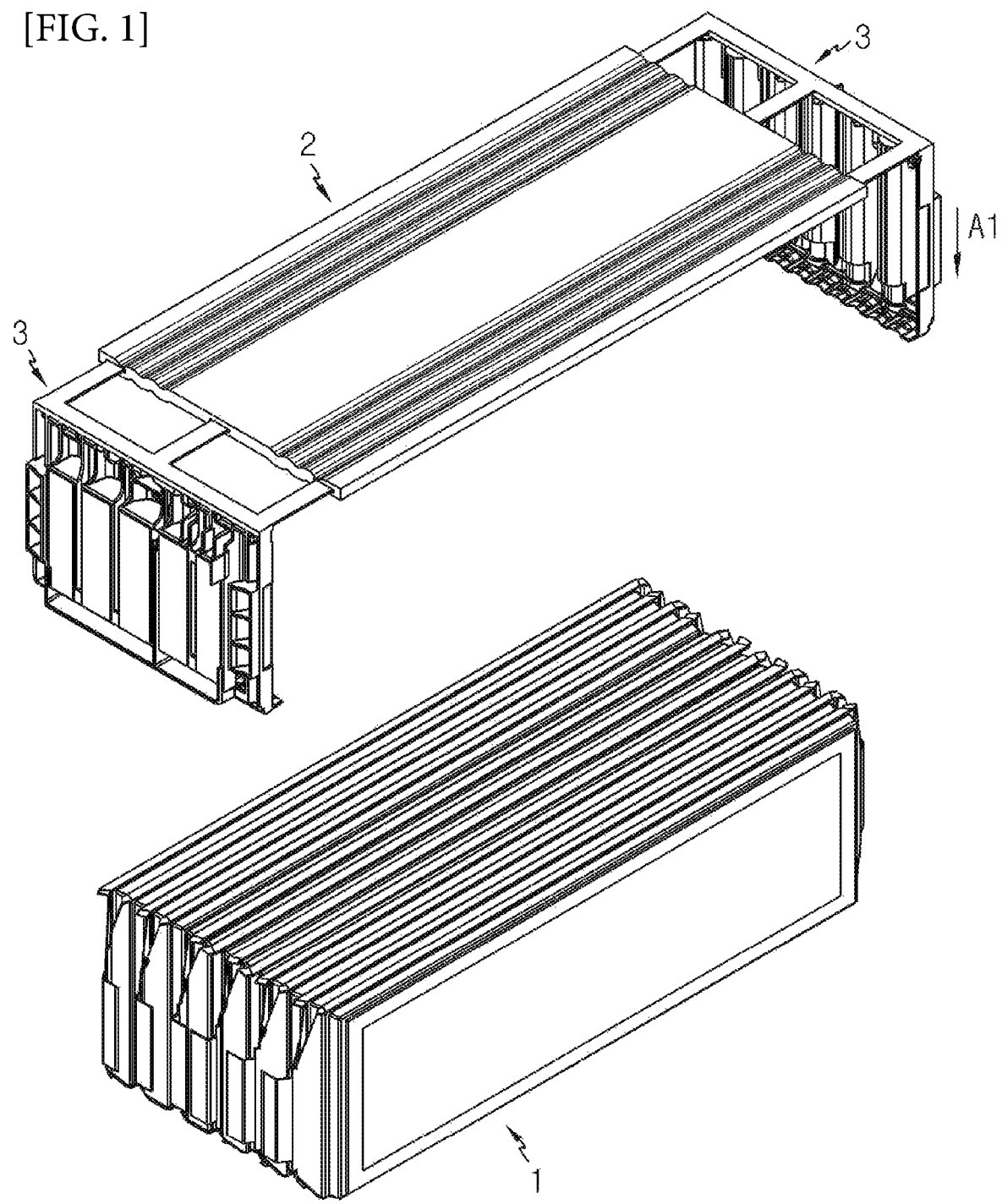
Background Art

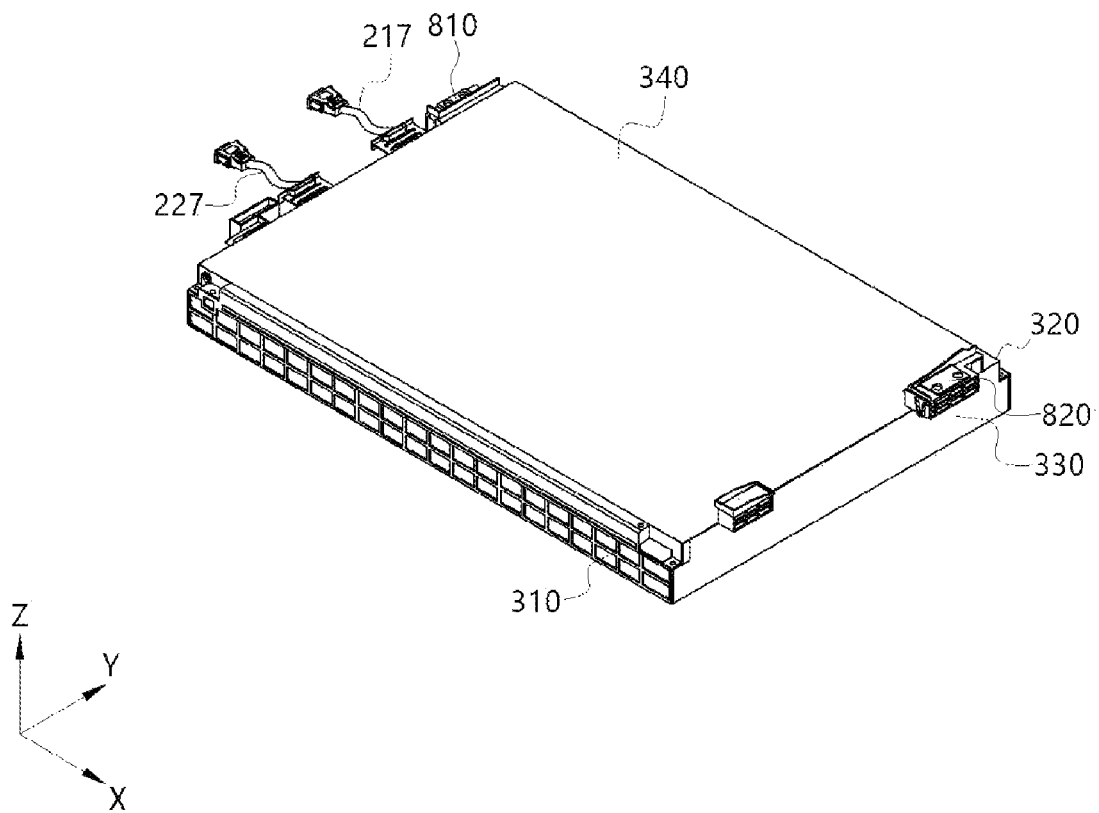
[FIG. 2]

[FIG. 3]
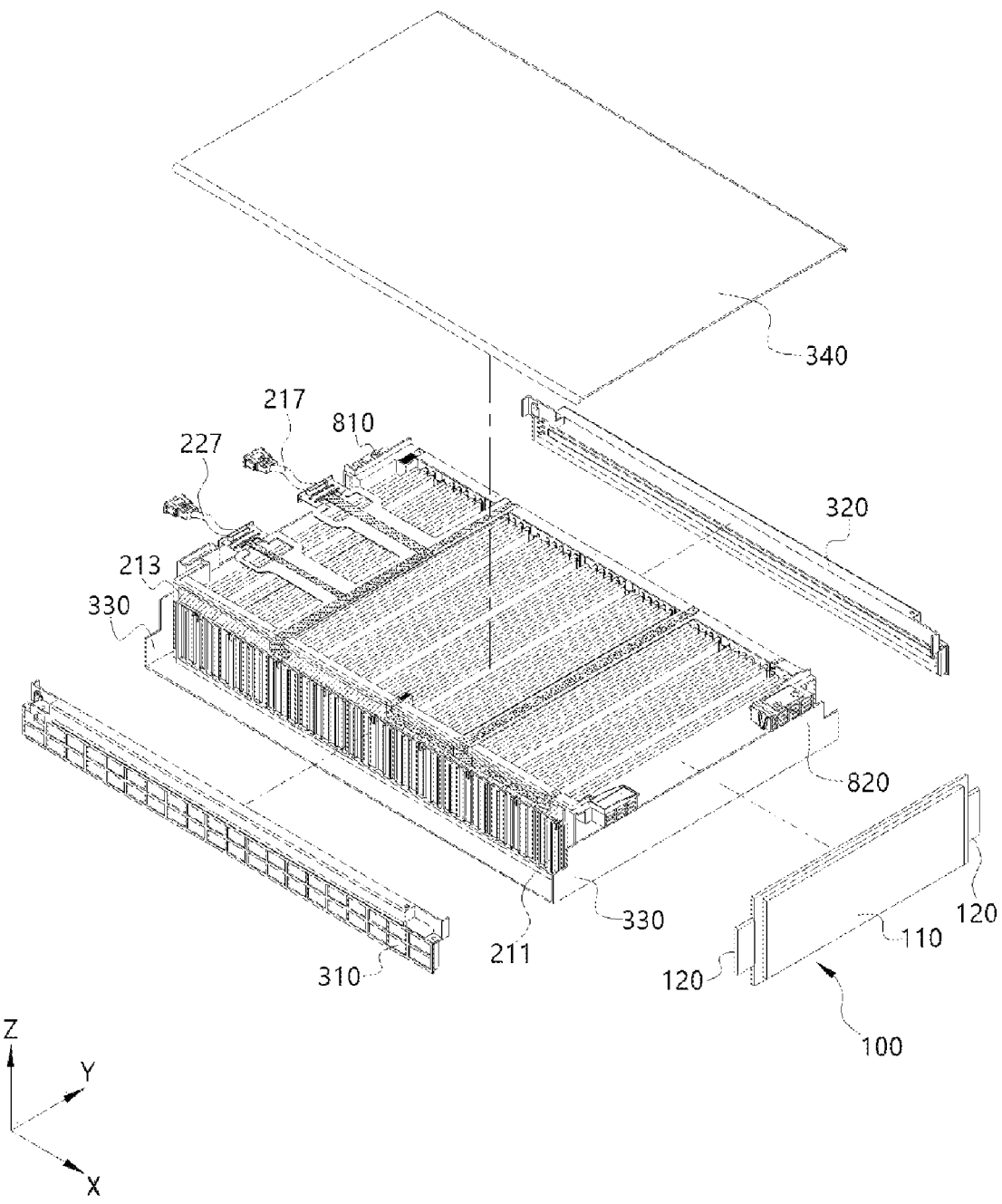

[FIG. 4]
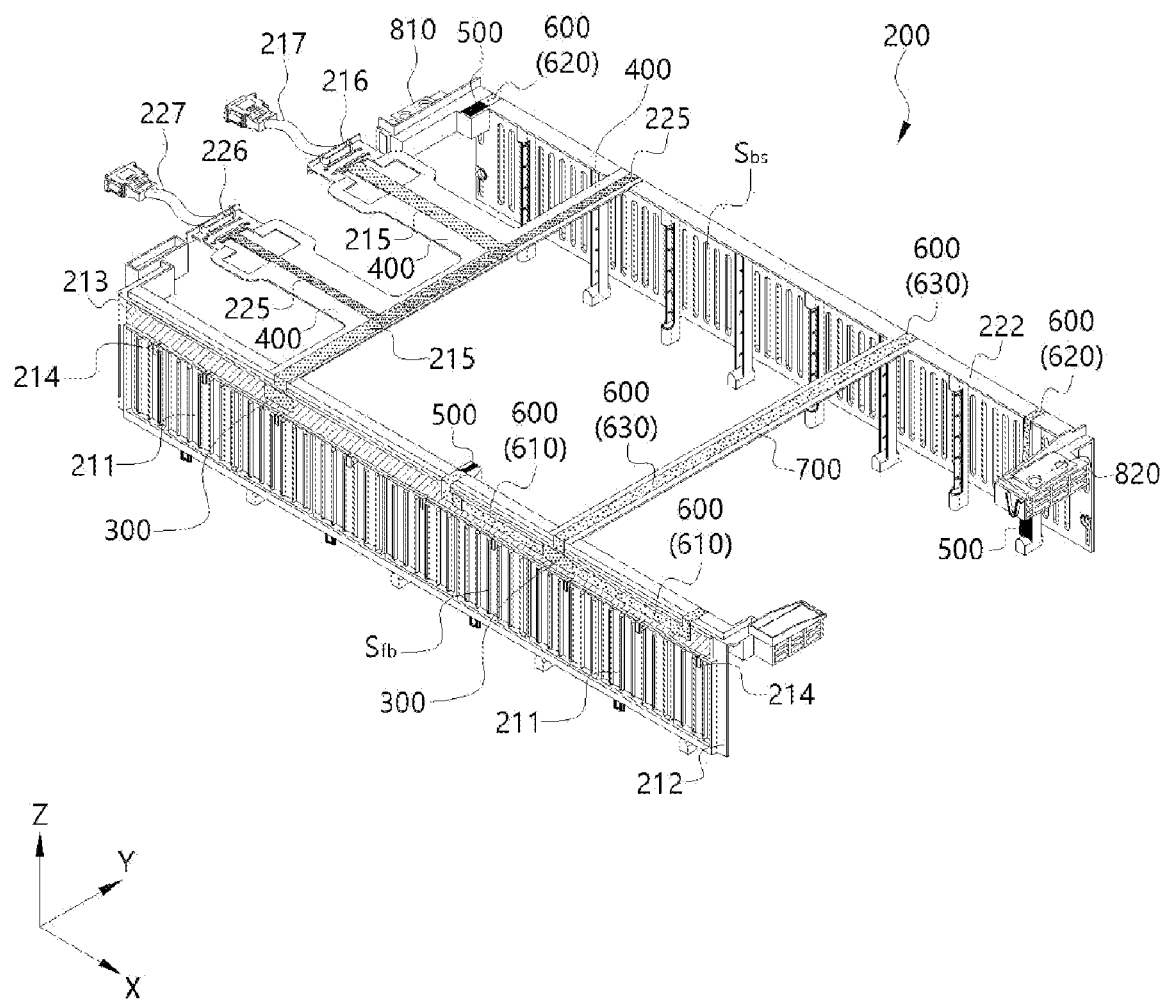

[FIG. 5]
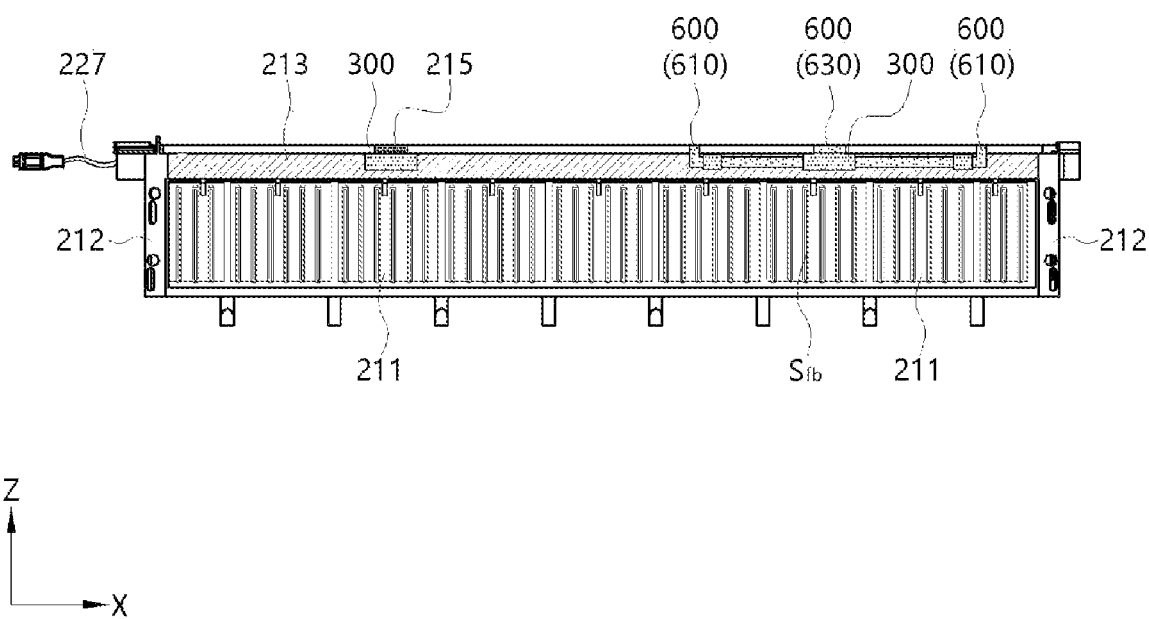

[FIG. 6]
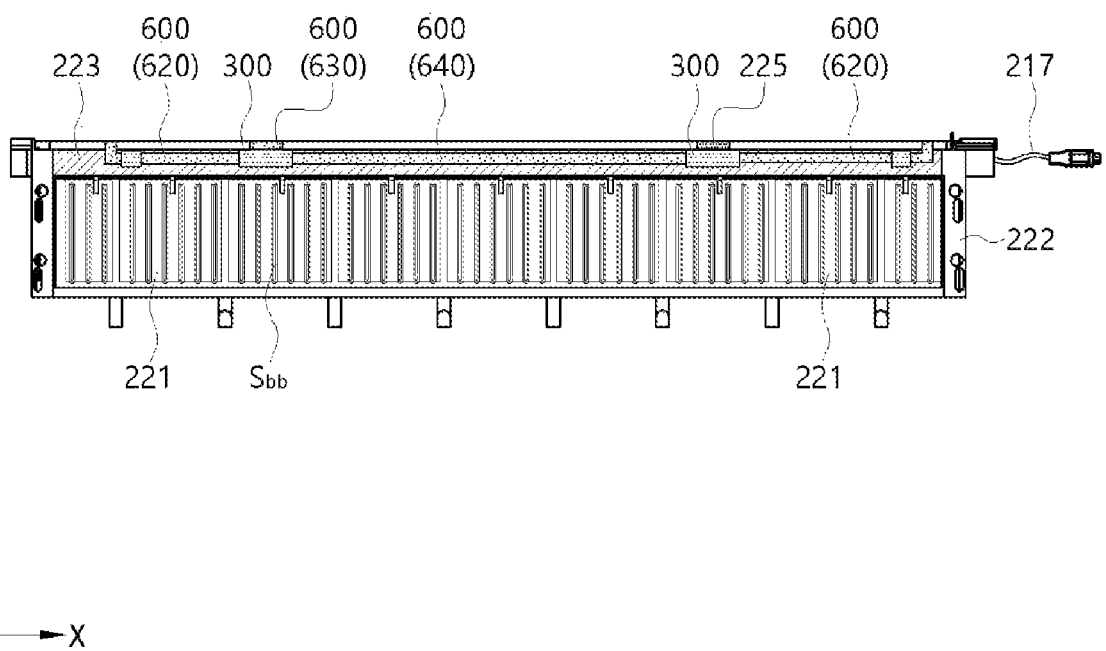

[FIG. 7]
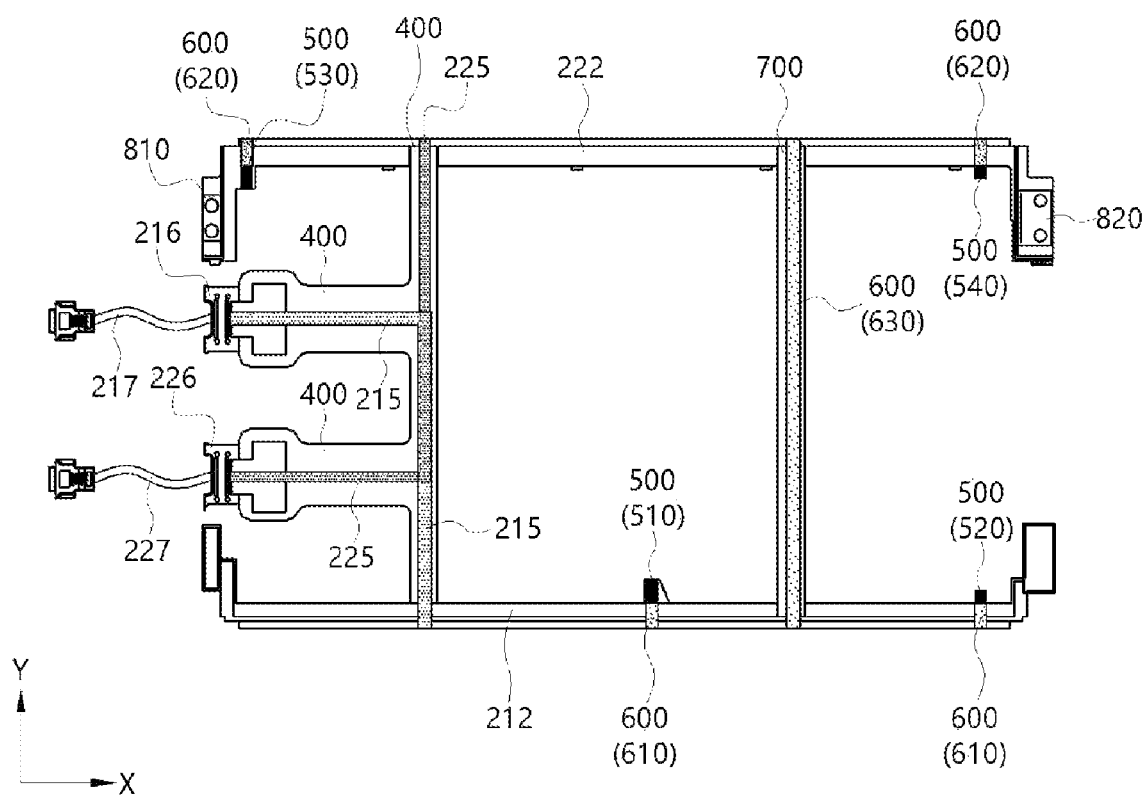

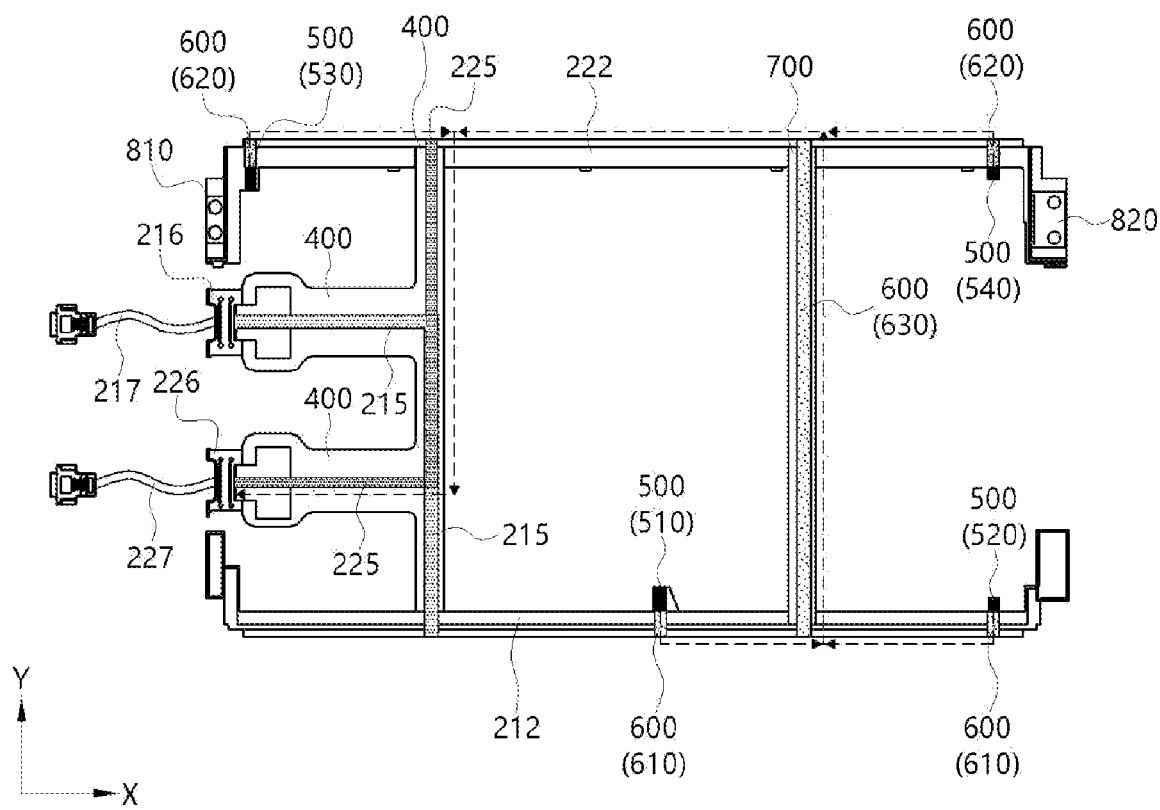
[FIG. 8]

BATTERY MODULE

CROSS-REFERENCE TO RELATED APPLICATIONS

This application claims priority under 35 U.S.C. § 119 to Korean Patent Application No. 10-2021-0003729, filed on Jan. 12, 2021, in the Korean Intellectual Property Office, the disclosure of which is incorporated herein by reference in its entirety.

TECHNICAL FIELD

The following disclosure relates to a battery module having improved energy efficiency per volume.

BACKGROUND

A rechargeable battery is a device converting external electrical energy into chemical energy and storing the chemical energy to generate electricity when needed, and may be used in various fields such as an electronic device that uses electricity, an electric vehicle and a hybrid vehicle.

The rechargeable battery may be manufactured to have a shape of a battery module in which a plurality of battery cells are stacked on each other in one direction. Here, it is possible to sense a voltage of the battery cell included in the battery module by electrically connecting an electrode tab formed on each side of one battery cell and an electrode tab formed on each side of the other battery cell to each other. In this regard, a sensing assembly may be a member included in the battery module to sense a characteristic of the battery cell such as the voltage of a battery cell, as described above.

The following Patent Document 1 discloses a battery module as shown in FIG. 1 in order to calculate the characteristic of such a battery cell.

The battery module shown in FIG. 1 includes a cell assembly 1 including a plurality of rechargeable batteries, an upper housing 2 disposed on a top portion of the cell assembly, and a sensing block 3 having a bus bar in contact with an electrode lead of the rechargeable battery. One purpose of the battery module shown in FIG. 1 is to have an improved assembling characteristic. The battery module shown in FIG. 1 has sensing block 3 slidably-coupled to the upper housing 2 in order to improve the assembling characteristic. However, when using a sensing block 3 which is slidably-coupled to the upper housing 2, the battery module may have an increased overall volume, thereby lowering its energy efficiency per volume.

RELATED ART DOCUMENT

Patent Document (Patent Document 1) Korean Patent Laid-Open Publication No. 2018-0135701 (Dec. 21, 2018)

SUMMARY

One exemplary embodiment of the present disclosure is directed to providing a battery module having an improved energy efficiency per volume.

Another exemplary embodiment of the present disclosure is directed to providing a battery module having a reduced risk of damage from impact.

However, the technical concerns to be solved by the present disclosure are not limited to the aforementioned problems, and other technical problems of the present disclosure not mentioned herein will be understood by those skilled in the art from the following description of the present disclosure.

In one general aspect, a battery module includes: a plurality of battery cells; a front bus bar coupled to any one of the positive and negative electrode tabs of each of the plurality of battery cells; a front support supporting the front bus bar; a front rigid printed circuit board (RPCB) disposed outside the front support and electrically connected to the front bus bar; a front flexible printed circuit board (FPCB) electrically connected to the front RPCB; a first wire electrically connected to the front FPCB to output information transmitted through the front FPCB to an external device of the battery module; a rear bus bar coupled to another one of the positive and negative electrode tabs of each of the plurality of battery cells; a rear support supporting the rear bus bar; a rear RPCB disposed outside the rear support and electrically connected to the rear bus bar; a rear FPCB electrically connected to the rear RPCB; and a second wire electrically connected to the rear FPCB to output information transmitted through the rear FPCB to the external device of the battery module.

The front bus bar and the front RPCB may be disposed parallel to each other in a height direction of the battery module, and the rear bus bar and the rear RPCB may also be disposed parallel to each other in the height direction of the battery module.

The battery module according to the present disclosure may further include: a front conductor having one side connected to the front bus bar and another side connected to the front RPCB; and a rear conductor having one side connected to the rear bus bar and another side connected to the rear RPCB.

The front RPCB may be disposed outside the front support, and the rear RPCB may be disposed outside the rear support.

The battery module according to the present disclosure may further include: a first connector coupled to each of the front FPCB and the first wire to electrically connect the front FPCB and the first wire to each other; and a second connector coupled to each of the rear FPCB and the second wire to electrically connect the rear FPCB and the second wire to each other.

The front FPCB may include a portion formed along a width direction of the battery module and another portion formed along a longitudinal direction of the battery module, and the rear FPCB may also include a portion formed along the width direction of the battery module and another portion formed along the longitudinal direction of the battery module.

The battery module according to the present disclosure may further include a front and rear FPCB support supporting the front FPCB and the rear FPCB by being disposed on a top portion of the plurality of battery cells, and simultaneously, on a bottom portion of the front FPCB and a bottom portion of the rear FPCB.

The battery module according to the present disclosure may further include at least one temperature sensor positioned inside the front support or the rear support, and sensing a temperature of at least one battery cell of the plurality of battery cells.

The temperature sensor may be positioned on each of the upper and lower portions of the front support or on each of the upper and lower portions of the rear support.

The battery module according to the present disclosure may further include a transmission path FPCB for transmitting temperature information, coupled with the front FPCB or the rear FPCB to provide a transmission path of the information on the temperature sensed by the temperature sensor.

The transmission path FPCB for transmitting the temperature information may include: a front temperature FPCB for transmitting front temperature information disposed on the front support, and providing a front support transmission path of the information on the temperature sensed by the temperature sensor positioned inside the front support; a rear temperature FPCB for transmitting rear temperature information disposed on the rear support, and providing a rear support transmission path of the information on the temperature sensed by the temperature sensor positioned inside the rear support; a collective FPCB for collecting the temperature information coupled with each of the front temperature FPCB and the rear temperature FPCB to collect the information on the temperature sensed by the temperature sensor positioned inside the front support and the information on the temperature sensed by the temperature sensor positioned inside the rear support; and a connection FPCB coupled with the collective FPCB, and transmitting the information on the temperature collected by the collective FPCB to the front FPCB or the rear FPCB.

The battery module according to the present disclosure may further include a support of the collective FPCB, physically supporting the collective FPCB by being disposed on the top portion of the plurality of battery cells, and simultaneously, on a bottom portion of the collective FPCB.

In another general aspect, a battery module comprising: a plurality of battery cells; at least one flexible printed circuit board (FPCB) disposed over the plurality of battery cells, and for transmission of at least voltage or temperature information from the plurality of battery cells; a FPCB support supporting the at least one FPCB by being disposed on a top portion of the plurality of battery cells, and simultaneously, on a bottom portion of the at least one FPCB; and a connector coupled to the FPCB support and connecting the at least one flexible printed circuit board to a wire leading outside the battery module.

BRIEF DESCRIPTION OF THE DRAWINGS

FIG. 1 is an exploded perspective view of a conventional battery module.

FIG. 2 is a perspective view of a battery module according to one exemplary embodiment of the present disclosure.

FIG. 3 is an exploded perspective view of the battery module according to another exemplary embodiment of the present disclosure.

FIG. 4 is a perspective view of a sensing assembly according to still another exemplary embodiment of the present disclosure.

FIG. 5 is a front view of the sensing assembly according to yet another exemplary embodiment of the present disclosure.

FIG. 6 is a rear view of the sensing assembly according to one exemplary embodiment of the present disclosure.

FIG. 7 is a plan view of a sensing assembly according to another exemplary embodiment of the present disclosure.

FIG. 8 is a view showing a path through which information on a temperature sensed by a temperature sensor is transmitted.

DETAILED DESCRIPTION OF EMBODIMENTS

Hereinafter, a battery module of the present disclosure will be described in detail with reference to the accompanying drawings. The accompanying drawings are only provided by way of example in order to sufficiently transfer the scope and spirit of the present disclosure to those skilled in the art, and the present disclosure is not limited to the accompanying drawing provided below, but may be implemented in other forms. In the present disclosure, an "item A" or an "item B" may indicate only the "item A," only the "item B" or both the "items A and B".

FIG. 2 is a perspective view of a battery module according to one exemplary embodiment of the present disclosure; and FIG. 3 is an exploded perspective view of the battery module according to another exemplary embodiment of the present disclosure.

Referring to FIGS. 2 to 4, a battery module 1000 according to one exemplary embodiment of the present disclosure may include a plurality of battery cells 100 and a sensing assembly 200.

In addition, the battery module 1000 may further include a front case 310, a rear case 320, side and lower cases 330 and an upper case 340 to cover the plurality of battery cells 100 and the sensing assembly 200. The front case 310 and the rear case 320 may be positioned to face each other and may cover the front and rear of the sensing assembly 200, respectively. The side and lower cases 330 may cover the side and bottom portion of the sensing assembly 200, and the upper case 340 may cover the top portion of the sensing assembly 200.

The plurality of battery cells 100 may each include a pouch 110 accommodating an electrode assembly and an electrode tab 120 protruding from each side of the pouch 110. Here, when the electrode tab 120 protruding from one side of the pouch 110 is a positive electrode tab, the electrode tab 120 protruding from the other side of the pouch 110 is a negative electrode tab. The plurality of battery cells 100 may be stacked on each other in a longitudinal direction of the battery module 1000 (i.e., +X axis direction in FIG. 2 although this direction is merely illustrative), and the pouch 110 of each battery cell 100 may be in surface contact with the pouch of another (adjacent) battery cell.

Each of FIGS. 4 to 8 is a view of the sensing assembly 200 included in the battery module 1000. In detail, FIG. 4 is a perspective view of the sensing assembly according to one exemplary embodiment of the present disclosure; FIG. 5 is a front view of the sensing assembly according to another exemplary embodiment of the present disclosure; FIG. 6 is a rear view of the sensing assembly according to still another exemplary embodiment of the present disclosure; FIG. 7 is a plan view of the sensing assembly according to yet another exemplary embodiment of the present disclosure; and FIG. 8 is a view showing a path through which information on a temperature sensed by a temperature sensor is transmitted. Hereinafter, the sensing assembly 200 and the battery module 1000 including the same according to one exemplary embodiment of the present disclosure will be described with further reference to FIGS. 4 to 8.

The sensing assembly 200 according to one exemplary embodiment of the present disclosure includes: a front bus bar 211, a front support 212, a front rigid printed circuit board (RPCB) 213, a front flexible printed circuit board (FPCB) 215, a first wire 217, and a rear bus bar 221, a rear support 222, a rear RPCB 223, a rear FPCB 225 and a second wire 227.

The front bus bar 211 may be coupled to the electrode tab 120, i.e. to any one of the positive and negative electrode tabs, of each of the plurality of battery cells 100. Here, the front bus bar 211 may be electrically connected to any one of the positive and negative electrode tabs of each battery cell 100 for example by welding or soldering, and the front bus bar 211 may sense a voltage of at least one battery cell 100 by this electrical connection. Information on the voltage of at least one battery cell 100, sensed by the front bus bar 211, may be transmitted to the first wire 217 through the front RPCB 213 and the front FPCB 215, described below. First wire 217 and second wire 227 (to be described later) may be composed of multiple wires for transmission of different information from the sensing assembly. Similarly, the flexible printed circuit boards may be composed of multiple conductive lines for transmission of different information within the sensing assembly.

The front support 212 may serve to fix the plurality of front bus bars 211. The front support 212 may include a slit positioned in a height direction of the battery module 1000 (i.e., +Z axis direction in FIG. 2 although this direction is merely illustrative), and the front bus bar 211 may also include a slit $S_{fb}$ (as shown in FIG. 4) having the same size as the slit $S_{bS}$ (also shown in FIG. 4) positioned in the front support 212. Here, a height of the slit(s) positioned in each of the front bus bar 211 and the front support 212 may be the same as or slightly larger than a height of the electrode tab 120.

The front bus bar 211 may be disposed outside the front support 212 (i.e., in a −Y axis direction with respect to the front support 212 in FIG. 4 although this direction is merely illustrative), and may be fixed to the front support 212 by conventional fixing means (e.g., bolt, welding, soldering, or adhesion). Here, it is preferable in one embodiment to dispose the slit $S_{fb}$ of the front bus bar 211 and the slit of the front support 212 to correspond to each other. The electrode tab 120 of each battery cell 100 may be sequentially inserted into the slit of the front support 212, and the slit $S_{fb}$ of the front bus bar 211, and the front bus bar 211 and the electrode tab 120 may then be welded (or soldered) and electrically connected to each other.

The front RPCB 213 may be electrically connected to the front bus bar 211. Here, the front RPCB 213 may be disposed outside the front support 212 like the front bus bar 211. When the front RPCB 213 is disposed outside the front support 212, the front support 212 may have an improved rigidity compared to a case where a flexible PCB (FPCB) is disposed outside the front support 212.

The front bus bar 211 and the front RPCB 213 may be electrically connected to each other by using a method such as welding (or soldering). Here, the front bus bar 211 and the front RPCB 213 may be welded (or soldered) to each other after a portion of the front RPCB 213 is disposed on an upper portion of the front bus bar 211.

Alternatively, the front bus bar 211 and the front RPCB 213 may be electrically connected to each other through a front conductor 214 having one side connected to the front bus bar 211 and the other side connected to the front RPCB 213. Here, the front bus bar 211 and the front RPCB 213 may be electrically connected to each other through the front conductor 214 by disposing the front bus bar 211 and the front RPCB 213 parallel to each other in the height direction of the battery module 1000 (i.e., +Z axis direction in FIG. 2 although this direction is merely illustrative), disposing the front conductor 214 on each upper portion of the front bus bar 211 and the front RPCB 213, and then welding (or soldering) the front bus bar 211 and the front conductor 214 to each other, and the front RPCB 213 and the front conductor 214 to each other.

As such, when the front conductor 214 is used to electrically connect the front bus bar 211 and the front RPCB 213 to each other, the battery module 1000 may have a smaller size in a width direction (i.e., +Y axis direction in FIG. 2 although this direction is merely illustrative) compared to a case where a portion of the front RPCB 213 is disposed on the upper portion of the front bus bar 211, and the front bus bar 211 and the front RPCB 213 are then welded to each other.

The front FPCB 215 may have one side electrically connected to the front RPCB 213, and the other side electrically connected to the first wire 217 through a first connector 216 described below. Here, a protection pad 300 may be positioned covering the front FPCB 215 in a region where the front FPCB 215 is positioned and/or in a region where the front RPCB 213 is positioned in order to more reliably implement the electrical connection between the front FPCB 215 and the front RPCB 213.

The RPCB or the wire is conventionally used instead of the FPCB to provide a transmission path of the information on the voltage sensed by the front bus bar 211, which may result in a larger size of the battery module 1000 in the height direction (e.g., in the +Z axis direction in FIG. 2). Accordingly, the present disclosure uses the FPCB (i.e., front FPCB 215) to provide the transmission path of the information on the voltage sensed by the front bus bar 211, which may allow the battery module 1000 to have a smaller size in the height direction (e.g., in the +Z axis direction in FIG. 2) compared to the case of using the RPCB or the wire.

The first connector 216 may be coupled to each of the front FPCB 215 and the first wire 217 to electrically connect the front FPCB 215 and the first wire 217 to each other. In more detail, the first connector 216 may have one side to which the front FPCB 215 is coupled, and the other side to which the first wire 217 is coupled. It is possible to more reliably implement the electrical connection between the front FPCB 215 and the first wire 217 by electrically connecting the front FPCB 215 and the first wire 217 to each other through the first connector 216 which is itself coupled to and held by the front and rear FPCB support 400 (described in more detail later).

The first wire 217 may be electrically connected to the front FPCB 215, and output the information transmitted to an external device of the battery module 1000 through the front FPCB 215. Here, the information transmitted through the front FPCB 215 may be information on the voltage of at least one or more battery cells 100 or information on temperature as described below.

One end of the first wire 217 may be directly connected to the front FPCB 215. Alternatively, one end of the first wire 217 may be indirectly connected to the front FPCB 215 by being connected to the first connector 216. The other end of the first wire 217 may be connected to a battery management system of an electric vehicle, for example. In this case, the battery management system may perform voltage balancing of the plurality of battery cells 100 or control charging and discharging of the plurality of battery cells 100, by using the information output from the first wire 217.

As described above, one end of the front FPCB 215 may be electrically connected to the front RPCB 213, and the other end of the front FPCB 215 may be electrically connected to the first wire 217. Here, the first wire 217 may serve as a conductor connected to the battery management system or the like, and may thus preferably in one embodiment be positioned at any end of the battery module 1000. Accordingly, as shown in FIG. 4, it is preferable in one embodiment that the front FPCB 215 includes a portion formed along the width direction of the battery module 1000 (in more detail, e.g. in the +Y axis direction in FIG. 4), and a portion formed along the longitudinal direction of the battery module 1000 (in more detail, e.g., −X axis direction in FIG. 4).

The FPCB may have a thickness significantly smaller than a printed circuit board (PCB) or a wire, and may thus contribute to reducing the size of the battery module 1000 in the height direction (e.g., in the +Z axis direction in FIG. 4). However, the FPCB may be vulnerable to external friction, and be at risk of damage, being easily torn for example, occurring during actual use. Accordingly, the battery module may preferably in one embodiment include a front and rear FPCB support 400 physically supporting the front FPCB 215 and the rear FPCB 225 firmly by being disposed on a top portion of the plurality of battery cells 100, and simultaneously, on a bottom portion of the front FPCB 215 and on a bottom portion of the rear FPCB 225 to be described below. When such a front and rear FPCB support 400 is positioned on the battery module 1000, it is possible to prevent a possibility that the plurality of battery cells 100 will directly rub against the front FPCB 215 and the rear FPCB 225, thereby significantly reducing the risk of damage to the front FPCB 215 and rear FPCB 225.

The rear bus bar 221 (shown in FIG. 6) may be coupled to the electrode tab 120 of each of the plurality of battery cells 100. When the rear bus bar 221 is coupled to any one of the positive and negative electrode tabs of each of the plurality of battery cells 100, the rear bus bar 221 positioned to face the front bus bar 211 may be coupled to another one of the positive and negative electrode tabs of each of the plurality of battery cells 100. Here, the rear bus bar 221 may be electrically connected to another one of the positive and negative electrode tabs of each battery cell 100 by welding (or soldering), and the rear bus bar 221 may sense the voltage of at least one battery cell 100 by this electrical connection. Information on the voltage of at least one battery cell 100, sensed by the rear bus bar 221, may be transmitted to the second wire 227 through the rear RPCB 223 and the rear FPCB 225, described below.

The rear support 222 may serve to fix the plurality of rear bus bars 221. The rear support 222 may include a slit $S_{bS}$ (as shown in FIG. 4) positioned in the height direction of the battery module 1000 (i.e., +Z axis direction in FIG. 2), and the rear bus bar 221 may also include a slit $S_{bb}$ (as shown in FIG. 6) having the same size as the slit positioned in the rear support 222. Here, a height of the slit(s) positioned in each of the rear bus bar 221 and the rear support 222 may be the same as or slightly larger than the height of the electrode tab 120.

The rear bus bar 221 may be disposed outside the rear support 222 (i.e., in the +Y axis direction with respect to the rear support 222 in FIG. 4), and may be fixed to the rear support 222 by the conventional fixing means (e.g., bolt, welding, soldering, or adhesion). Here, it is preferable in one embodiment to dispose the slit $S_{bb}$ of the rear bus bar 221 and the slit of the rear support 222 to correspond to each other. The electrode tab 120 of each battery cell 100 may be sequentially inserted into the slit $S_{bS}$ of the rear support 222 and the slit $S_{bb}$ of the rear bus bar 221, and the rear bus bar 221 and the electrode tab 120 may then be welded and electrically connected to each other.

The rear RPCB 223 may be electrically connected to the rear bus bar 221. Here, the rear RPCB 223 may be disposed outside the rear support 222 like the rear bus bar 222. When the rear RPCB 223 is disposed outside the rear support 222, the rear support 222 may have an improved rigidity compared to a case where the FPCB is disposed outside the rear support 222.

The rear bus bar 221 and the rear RPCB 223 may be electrically connected to each other by using the method such as welding. Here, the rear bus bar 221 and the rear RPCB 223 may be welded to each other after a portion of the rear RPCB 223 is disposed on an upper portion of the rear bus bar 221.

Alternatively, the rear bus bar 221 and the rear RPCB 223 may be electrically connected to each other through a rear conductor 224 having one side connected to the rear bus bar 221 and the other side connected to the rear RPCB 223. Here, the rear bus bar 221 and the rear RPCB 223 may be electrically connected to each other through the rear conductor 224 by disposing the rear bus bar 221 and the rear RPCB 223 parallel to each other in the height direction of the battery module 1000 (i.e., +Z axis direction in FIG. 2), disposing the rear conductor 224 on each upper portion of the rear bus bar 221 and the rear RPCB 223, and then welding the rear bus bar 221 and the rear conductor 224 to each other, and the rear RPCB 223 and the rear conductor 224 to each other.

As such, when the rear conductor 224 is used to electrically connect the rear bus bar 221 and the rear RPCB 223 to each other, the battery module 1000 may have a smaller size in the width direction (i.e., +Y axis direction in FIG. 2) compared to a case where a portion of the rear RPCB 223 is disposed on the upper portion of the rear bus bar 221, and the rear bus bar 221 and the rear RPCB 223 are then welded (or soldered) to each other.

The rear FPCB 225 may have one side electrically connected to the rear RPCB 223, and the other side electrically connected to the second wire 227 through a second connector 226 described below. Here, the protection pad 300 may be positioned covering the rear FPCB 225 in a region where the rear FPCB 225 is positioned and/or in a region where the rear RPCB 223 is positioned in order to more reliably implement the electrical connection between the rear FPCB 225 and the rear RPCB 223.

The RPCB or the wire is conventionally used instead of the FPCB to provide a transmission path of the information on the voltage sensed by the rear bus bar 221, which may result in the larger size of the battery module 1000 in the height direction (+Z axis direction in FIG. 2). Accordingly, the present disclosure uses the FPCB (i.e., rear FPCB 225) to provide the transmission path of the information on the voltage sensed by the rear bus bar 221, which may allow the battery module 1000 to have the smaller size in the height direction (+Z axis direction in FIG. 2) compared to the case of using the RPCB or the wire.

The second connector 226 may be coupled to each of the rear FPCB 225 and the rear wire 227, and electrically connect the rear FPCB 225 and the second wire 227 to each other. In more detail, the second connector 226 may have one side to which the rear FPCB 225 is coupled, and the other side to which the second wire 227 is coupled. It is possible to more reliably implement the electrical connection between the rear FPCB 225 and the second wire 227 by electrically connecting the rear FPCB 225 and the second wire 227 to each other through the second connector 226.

The second wire 227 may be electrically connected to the rear FPCB 225, and output the information transmitted through the rear FPCB 225 to the external device of the battery module 1000. Here, the information transmitted through the rear FPCB 225 may be information on the voltage of at least one or more battery cells 100 and/or information on a temperature thereof as described below.

One end of the second wire 227 may be directly connected to the rear FPCB 225. Alternatively, one end of the second wire 227 may be indirectly connected to the rear FPCB 225 by being connected to the second connector 226. The other end of the second wire 227 may be connected to the battery management system of an electric vehicle, for example. In this case, the battery management system may perform the voltage balancing of the plurality of battery cells 100 or control the charging and discharging of the plurality of battery cells 100, by using the information output from the second wire 227.

As described above, one end of the rear FPCB 225 may be electrically connected to the rear RPCB 223, and the other end of the rear FPCB 225 may be electrically connected to the second wire 227. Here, the second wire 227 may serve as the conductor connected to the battery management system or the like, and may thus preferably in one embodiment be positioned at any one end of the battery module 1000. Accordingly, as shown in FIG. 4, it is preferable in one embodiment that the rear FPCB 225 includes a portion formed along the width direction of the battery module 1000 (in more detail, e.g., in the −Y axis direction in FIG. 4), and a portion formed along the longitudinal direction of the battery module 1000 (in more detail, e.g., in the −X axis direction in FIG. 4).

The FPCBs 215 and 225 may be significantly thinner compared to the printed circuit board (PCB) or the wire, and may thus contribute to reducing the size of the battery module 1000 in the height direction (e.g., in the +Z axis direction in FIG. 4). However, the FPCB may be vulnerable to the external friction, and have be at risk of damage, being easily torn for example, occurring during the actual use. Accordingly, as described above, the battery module may preferably in one embodiment include the front and rear FPCB support 400 physically supporting the front FPCB 215 and the rear FPCB 225 firmly by being disposed on the top portion of the plurality of battery cells 100, and simultaneously, on the bottom portion of the front FPCB 215 and on the bottom portion of the rear FPCB 225.

Meanwhile, the battery module 1000 may include at least one temperature sensor 500. The temperature sensor 500 may be positioned inside the front support 212 (e.g., in the +Y axis direction with respect to the front support 212 in FIG. 4) or the rear support 222 (e.g., in the −Y axis direction with respect to the rear support 222 in FIG. 4), and may sense a temperature of at least one battery cell of the plurality of battery cells 100.

Here, the temperature sensor 500 may be positioned on each of the upper and lower portions of the front support 212, and may sense a temperature of an upper front region of the battery cell 100 and a temperature of a lower front region of the battery cell 100. In addition, the temperature sensor 500 may be positioned on each of the upper and lower portions of the rear support 222, and may sense a temperature of an upper rear region of the battery cell 100 and a temperature of a lower rear region of the battery cell 100. As the temperature sensor 500 is evenly disposed in each region of the battery cell 100 in this way, it is possible to accurately sense temperature uniformity of the battery module 1000.

The information on the temperature of the battery cell 100 sensed by the temperature sensor 500 may be required to be finally output to the outside (e.g., to the afore-mentioned battery management system) of the battery module 1000 through the first wire 217 or the second wire 227. To this end, the sensing assembly 200 may include an FPCB 600 (that is a transmission path FPCB) for transmitting temperature information, which is electrically connected to the temperature sensor 500. The FPCB 600 for transmitting the temperature information may be coupled with the front FPCB 215 or the rear FPCB 225 to provide a transmission path of the information on the temperature of the battery cell 100 sensed by the temperature sensor 500.

The FPCB 600 for transmitting the temperature information may include an FPCB 610 for transmitting front temperature information, an FPCB 620 for transmitting rear temperature information, an FPCB 630 for collecting the temperature information and a connection FPCB 640.

The FPCB 610 for transmitting the front temperature information may be disposed on the front support 212, and provide the transmission path of the information on the temperature sensed by the temperature sensor 500 (including temperature sensors 510 and 520) positioned inside the front support 212. Here, the temperature sensor 500 positioned inside the front support 212 may include an upper front temperature sensor 510 positioned on the upper inside of the front support 212, and a lower front temperature sensor 520 positioned on the lower inside of the front support 212. Some of the FPCB 610 for transmitting the front temperature information may be disposed on the front RPCB 213.

The FPCB 620 for transmitting the rear temperature information may be disposed on the rear support 222, and provide the transmission path of the information on the temperature sensed by the temperature sensor 500 (including temperature sensors 530 and 540) positioned inside the rear support 222. Here, the temperature sensor 500 positioned inside the rear support 222 may include an upper rear temperature sensor 530 positioned on the upper inside of the rear support 222, and a lower rear temperature sensor 540 positioned on the lower inside of the rear support 222. Some of the FPCB 620 for transmitting the rear temperature information may be disposed on the rear RPCB 223.

The FPCB 630 for collecting the temperature information may be coupled with each of the FPCB 610 for transmitting the front temperature information and the FPCB 620 for transmitting the rear temperature information to collect the information on the temperature sensed by the temperature sensor 500 (i.e. temperature sensors 510 and 520) positioned inside the front support 212 and the information on the temperature sensed by the temperature sensor 500 (i.e. temperature sensors 530 and 540) positioned inside the rear support 222. That is, the FPCB 630 for collecting the temperature information may have one side coupled with the FPCB 610 for transmitting the front temperature information and the other side coupled with the FPCB 620 for transmitting the rear temperature information.

The connection FPCB 640 may be coupled with the FPCB 630 for collecting the temperature information, and transmit the information on the temperature collected by the FPCB 630 for collecting the temperature information to the front FPCB 215 or the rear FPCB 225. That is, the connection FPCB 640 may have one side coupled with the FPCB 630 for collecting the temperature information, and the other side coupled with the front FPCB 215 or the rear FPCB 225. FIG. 6 shows in one embodiment that the other side of the connection FPCB 640 is coupled with the rear FPCB 225. However, in another embodiment, the other side of the connection FPCB 640 may be coupled with the front FPCB 215 when switching the positions of the temperature sensor 500 and the FPCB 600 for transmitting the temperature information to each other.

The protection pad 300 may be positioned on each of their coupling portions to more reliably implement the coupling of the FPCB 610 for transmitting the front temperature information and the FPCB 630 for collecting the temperature information, the coupling of the FPCB 620 for transmitting the rear temperature information and the FPCB 630 for collecting the temperature information, the coupling of the FPCB 630 for collecting the temperature information and the connection FPCB 640, and the coupling of the FPCB 215 and 225 and the connection FPCB 640. In addition, the coupling between the FPCB may include an electrical connection.

Referring mainly to FIG. 8, the information on the temperature sensed by the rear upper temperature sensor 530 may be transmitted to the second wire 227 through the FPCB 620 for transmitting the rear temperature information and the rear FPCB 225. In addition, the temperature information sensed by the lower rear temperature sensor 540 may be transmitted to the second wire 227 through the FPCB 620 for transmitting the rear temperature information, the connection FPCB 640 and the rear FPCB 225.

The information on the temperature sensed by the upper front temperature sensor 510 may be collected to a rear side of the sensing assembly 200 (e.g., in the +Y axis direction in FIG. 8) through the FPCB 610 for transmitting the front temperature information and the FPCB 630 for collecting the temperature information. In addition, the information on the temperature sensed by the lower front temperature sensor 520 may also be collected to the rear side of the sensing assembly 200 through the FPCB 610 for transmitting the front temperature information and the FPCB 630 for collecting the temperature information. The information on the temperature sensed by the upper front temperature sensor 510 and the information on the temperature sensed by the lower front temperature sensor 520 may then be transmitted to the second wire 227 through the connection FPCB 640 and the rear FPCB 225.

As the FPCB 600 for transmitting the temperature information is configured in this way, the information on the temperature sensed by the temperature sensors 500 (including temperature sensors 510, 520, 530 and 540) positioned in various places may be collected and output from one wire (i.e., second wire 227 in the example above).

As described above, the FPCB(s) may have a thickness significantly smaller than RPCB or the wire, and may thus be vulnerable to the external friction to have a risk of damage. Accordingly, the battery module may preferably in one embodiment include a support 700 of the FPCB for collecting temperature information, physically supporting the FPCB 630 for collecting the temperature information firmly by being disposed on the top portion of the plurality of battery cells 100, and simultaneously, on a bottom portion of the FPCB 630 for collecting the temperature information. When the support 700 of the FPCB for collecting the temperature information is positioned on the battery module 1000, it is possible to prevent a possibility that the plurality of battery cells 100 will directly rub against the FPCB 630 for collecting the temperature information, thereby significantly reducing the risk of damage to the FPCB 630 for collecting the temperature information.

Meanwhile, as shown in FIGS. 7 and 8, the sensing assembly 200 may include a first bus bar terminal 810 and a second bus bar terminal 820. The first bus bar terminal 810 may be positioned on one side of the rear support 222 (e.g., left side in the Y axis direction in FIG. 4), and may be electrically connected to a bus bar terminal of another (e.g., adjacent) battery module to be disposed on the left side of the first bus bar terminal 810. The second bus bar terminal 820 may be positioned on the other side of the rear support 222 (e.g., right side in the Y axis direction in FIG. 4), and may be electrically connected to a bus bar terminal of another (e.g., adjacent) battery module to be disposed on the right side of the first bus bar terminal 820. That is, the first bus bar terminal 810 and the second bus bar terminal 820 may be used to electrically connect the battery module 1000 to another battery module.

As set forth above, the battery module according to the present disclosure may use the FPCB(s) to provide the transmission path of the information on the voltage or temperature thereof sensed by the bus bar. According to the present disclosure, the battery module may have a smaller size in the height direction compared to the case of using the RPCB or the wire instead of the FPCB to provide the transmission path of the information on the voltage or temperature, and thus have the improved energy efficiency per volume.

In addition, the battery module according to the present disclosure may use the wire to output the information transmitted through the FPCB to an external device of the battery module. According to present disclosure, it is possible to reduce the risk of damage not only to the FPCB but also to the battery module from the external shock compared to the case where the FPCB is exposed outward from the battery module as it is.

Although the present disclosure has been described with reference to the exemplary embodiments and the accompanying drawings, it is not limited to the above-mentioned exemplary embodiments but may be variously modified and changed from the above description by those skilled in the art to which the present disclosure pertains. Therefore, the scope and spirit of the present disclosure should be understood of the following claims, and all of the equivalences and equivalent modifications to the claims are intended to fall within the scope and spirit of the present disclosure.

What is claimed is:
1. A battery module comprising:
a plurality of battery cells contained in a case;
a first wire and a second wire configured to output information about the battery module to an external device;
a front bus bar coupled to any one of positive and negative electrode tabs of each of the plurality of battery cells;
a front rigid printed circuit board (RPCB) disposed outside a front support and electrically connected to the front bus bar, wherein the front support supporting both ends of the front bus bar and the front RPCB;
a front flexible printed circuit board (FPCB) has one end electrically connected to the front RPCB and the other end electrically connected to the first wire;
a rear bus bar coupled to another one of the positive and negative electrode tabs of each of the plurality of battery cells;
a rear RPCB disposed outside a rear support and electrically connected to the rear bus bar, wherein the rear support supporting both ends of the rear bus bar and the rear RPCB; and
a rear flexible printed circuit board (FPCB) has one end electrically connected to the rear RPCB and the other end electrically connected to the second wire,
wherein the front bus bar and the front RPCB are disposed parallel to each other in a height direction of the battery module,
wherein the rear bus bar and the rear RPCB are also disposed parallel to each other in the height direction of the battery module,
wherein the front FPCB and the rear FPCB are disposed over the plurality of battery cells, and
wherein the information transmitted to the front FPCB is output to the external device through the first wire, and the information transmitted to the rear FPCB is output to the external device through the second wire.

2. The battery module of claim 1, further comprising:
a front conductor having one side connected to the front bus bar and another side connected to the front RPCB; and
a rear conductor having one side connected to the rear bus bar and another side connected to the rear RPCB.

3. The battery module of claim 1, further comprising:
a first connector coupled to each of the front FPCB and the first wire to electrically connect the front FPCB and the first wire to each other; and
a second connector coupled to each of the rear FPCB and the second wire to electrically connect the rear FPCB and the second wire to each other.

4. The battery module of claim 1, wherein the front FPCB includes a portion formed along a width direction of the battery module and another portion formed along a longitudinal direction of the battery module, and
the rear FPCB also includes a portion formed along the width direction of the battery module and another portion formed along the longitudinal direction of the battery module.

5. The battery module of claim 1, further comprising a front and rear FPCB support supporting the front FPCB and the rear FPCB by being disposed on a top portion of the plurality of battery cells, and simultaneously, on a bottom portion of the front FPCB and a bottom portion of the rear FPCB.

6. The battery module of claim 1, further comprising at least one temperature sensor positioned inside the front support or the rear support, and sensing a temperature of at least one battery cell of the plurality of battery cells.

7. The battery module of claim 6, wherein the temperature sensor is positioned on each of the upper and lower portions of the front support or on each of the upper and lower portions of the rear support.

8. The battery module of claim 6, further comprising a transmission path FPCB for transmitting temperature information, coupled with the front FPCB or the rear FPCB to provide a transmission path of the information on the temperature sensed by the temperature sensor.

9. The battery module of claim 8, wherein the transmission path FPCB for transmitting the temperature information includes:
a front temperature FPCB for transmitting front temperature information disposed on the front support, and providing a front support transmission path of the information on the temperature sensed by the temperature sensor positioned inside the front support;
a rear temperature FPCB for transmitting rear temperature information disposed on the rear support, and providing a rear support transmission path of the information on the temperature sensed by the temperature sensor positioned inside the rear support;
a collective FPCB for collecting the temperature information coupled with each of the front temperature FPCB and the rear temperature FPCB to collect the information on the temperature sensed by the temperature sensor positioned inside the front support and the information on the temperature sensed by the temperature sensor positioned inside the rear support; and
a connection FPCB coupled with the collective FPCB, and transmitting the information on the temperature collected by the collective FPCB to the front FPCB or the rear FPCB.

10. The battery module of claim 9, further comprising a support of the collective FPCB, physically supporting the collective FPCB by being disposed on the top portion of the plurality of battery cells, and simultaneously, on a bottom portion of the collective FPCB.

* * * * *